(12) United States Patent
Yamazaki

(10) Patent No.: US 9,865,696 B2
(45) Date of Patent: Jan. 9, 2018

(54) SPUTTERING TARGET, METHOD FOR MANUFACTURING THE SAME, AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/530,872

(22) Filed: Nov. 3, 2014

(65) Prior Publication Data

US 2015/0050776 A1    Feb. 19, 2015

Related U.S. Application Data

(62) Division of application No. 13/323,930, filed on Dec. 13, 2011, now Pat. No. 8,894,825.

(30) Foreign Application Priority Data

Dec. 17, 2010 (JP) .................................. 2010-281429

(51) Int. Cl.
   *C23C 14/35* (2006.01)
   *H01L 29/49* (2006.01)
   (Continued)

(52) U.S. Cl.
   CPC ........ *H01L 29/4908* (2013.01); *C04B 35/453* (2013.01); *C04B 35/58* (2013.01);
   (Continued)

(58) Field of Classification Search
   CPC .......................... C23C 14/086; H01J 37/3426
   See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101663762 A | 3/2010 |
| EP | 1737044 A | 12/2006 |

(Continued)

OTHER PUBLICATIONS

Taiwanese Office Action (Application No. 100146579) dated Mar. 10, 2016.

(Continued)

*Primary Examiner* — Jason M Berman
(74) *Attorney, Agent, or Firm* — Fish & Richardson P.C.

(57) ABSTRACT

A deposition technique for forming an oxynitride film is provided. A highly reliable semiconductor element is manufactured with the use of the oxynitride film. The oxynitride film is formed with the use of a sputtering target including an oxynitride containing indium, gallium, and zinc, which is obtained by sintering a mixture of at least one of indium nitride, gallium nitride, and zinc nitride as a raw material and at least one of indium oxide, gallium oxide, and zinc oxide in a nitrogen atmosphere. In this manner, the oxynitride film can contain nitrogen at a necessary concentration. The oxynitride film can be used for a gate, a source electrode, a drain electrode, or the like of a transistor.

12 Claims, 8 Drawing Sheets

(51) Int. Cl.
- *C04B 35/453* (2006.01)
- *C04B 35/58* (2006.01)
- *C04B 35/645* (2006.01)
- *C23C 14/06* (2006.01)
- *C23C 14/34* (2006.01)
- *H01L 21/02* (2006.01)
- *H01L 21/443* (2006.01)

(52) U.S. Cl.
CPC ...... *C04B 35/6455* (2013.01); *C23C 14/0676* (2013.01); *C23C 14/3414* (2013.01); *H01L 21/02565* (2013.01); *H01L 21/443* (2013.01); *H01L 29/4966* (2013.01); *C04B 2235/3284* (2013.01); *C04B 2235/3286* (2013.01); *C04B 2235/3852* (2013.01); *C04B 2235/666* (2013.01); *C04B 2235/77* (2013.01)

(56) References Cited

U.S. PATENT DOCUMENTS

| | | | |
|---|---|---|---|
| 5,803,342 A | 9/1998 | Kardokus | |
| 5,836,506 A | 11/1998 | Hunt et al. | |
| 6,294,274 B1 | 9/2001 | Kawazoe et al. | |
| 6,328,857 B1 * | 12/2001 | Anzaki | C23C 14/3464 |
| | | | 204/192.12 |
| 6,329,275 B1 | 12/2001 | Ishigami et al. | |
| 6,563,174 B2 | 5/2003 | Kawasaki et al. | |
| 6,667,537 B1 | 12/2003 | Koike et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,699,965 B2 | 4/2010 | Ikisawa et al. | |
| 7,732,819 B2 | 6/2010 | Akimoto et al. | |
| 7,859,187 B2 | 12/2010 | Yamazaki et al. | |
| 7,872,722 B2 | 1/2011 | Kimura | |
| 7,964,918 B2 | 6/2011 | Kanegae et al. | |
| 8,183,099 B2 | 5/2012 | Sakata | |
| 8,274,078 B2 | 9/2012 | Itagaki et al. | |
| 8,333,913 B2 | 12/2012 | Inoue et al. | |
| 8,343,800 B2 | 1/2013 | Umeda et al. | |
| 8,455,371 B2 | 6/2013 | Yano et al. | |
| 8,492,756 B2 | 7/2013 | Sakata et al. | |
| 8,492,862 B2 | 7/2013 | Yamazaki et al. | |
| 8,668,849 B2 | 3/2014 | Inoue et al. | |
| 8,728,287 B2 | 5/2014 | Martin et al. | |
| 8,785,929 B2 | 7/2014 | Sakata et al. | |
| 8,803,149 B2 | 8/2014 | Sakata | |
| 9,040,985 B2 | 5/2015 | Sakata et al. | |
| 9,045,821 B2 | 6/2015 | Chichibu et al. | |
| 9,082,857 B2 | 7/2015 | Yamazaki et al. | |
| 2001/0008157 A1 | 7/2001 | Bishop et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0039670 A1 | 2/2005 | Hosono et al. | |
| 2005/0122443 A1 | 6/2005 | Kim et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0102907 A1 | 5/2006 | Lee et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0183625 A1 | 8/2006 | Miyahara | |
| 2006/0189132 A1 | 8/2006 | Iwabuchi et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0072232 A1 | 3/2009 | Hayashi et al. | |
| 2009/0073325 A1 | 3/2009 | Kuwabara et al. | |
| 2009/0114910 A1 | 5/2009 | Chang | |
| 2009/0127551 A1 | 5/2009 | Imai | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0236596 A1 | 9/2009 | Itai | |
| 2009/0267087 A1 | 10/2009 | Yang et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0072467 A1 | 3/2010 | Yamazaki et al. | |
| 2010/0084655 A1 | 4/2010 | Iwasaki et al. | |
| 2010/0092800 A1 * | 4/2010 | Itagaki | C30B 23/025 |
| | | | 428/697 |
| 2010/0109002 A1 * | 5/2010 | Itagaki | H01L 29/247 |
| | | | 257/43 |
| 2010/0109058 A1 | 5/2010 | Sakata et al. | |

(56) References Cited

U.S. PATENT DOCUMENTS

| | | | |
|---|---|---|---|
| 2010/0117073 | A1 | 5/2010 | Yamazaki et al. |
| 2010/0140609 | A1 | 6/2010 | Yano et al. |
| 2010/0258794 | A1 | 10/2010 | Iwasaki et al. |
| 2010/0283049 | A1 | 11/2010 | Sato et al. |
| 2010/0301328 | A1 | 12/2010 | Yamazaki et al. |
| 2011/0068335 | A1 | 3/2011 | Yamazaki et al. |
| 2011/0079777 | A1 | 4/2011 | Akimoto |
| 2011/0092017 | A1 | 4/2011 | Akimoto et al. |
| 2011/0114999 | A1 | 5/2011 | Yamazaki et al. |
| 2011/0215317 | A1 | 9/2011 | Yamazaki et al. |
| 2012/0056176 | A1 | 3/2012 | Yamazaki |
| 2012/0060750 | A1* | 3/2012 | Yamazaki ............... C23C 14/08 117/88 |
| 2012/0074407 | A1 | 3/2012 | Yamazaki et al. |
| 2012/0097942 | A1 | 4/2012 | Imoto et al. |
| 2012/0273779 | A1 | 11/2012 | Yamazaki et al. |
| 2012/0273780 | A1 | 11/2012 | Yamazaki et al. |
| 2013/0277895 | A1 | 10/2013 | Yamazaki et al. |
| 2015/0037912 | A1 | 2/2015 | Sakata |

FOREIGN PATENT DOCUMENTS

| | | |
|---|---|---|
| EP | 2226847 A | 9/2010 |
| EP | 2543507 A | 1/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-256838 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-035128 A | 2/2005 |
| JP | 2007-096055 A | 4/2007 |
| JP | 2007-123861 A | 5/2007 |
| JP | 2009-275236 A | 11/2009 |
| JP | 2010-080952 A | 4/2010 |
| JP | 2010-114423 A | 5/2010 |
| JP | 2010-135774 A | 6/2010 |
| JP | 2010-166030 A | 7/2010 |
| JP | 2010-523815 | 7/2010 |
| JP | 2010-177431 A | 8/2010 |
| JP | 2011-201301 A | 10/2011 |
| TW | 200902740 | 1/2009 |
| TW | 201041049 | 11/2010 |
| WO | WO-2004/114391 | 12/2004 |
| WO | WO-2008/114588 | 9/2008 |
| WO | WO-2008/133345 | 11/2008 |
| WO | WO-2010/071034 | 6/2010 |

OTHER PUBLICATIONS

Liu.P et al., "Nitrogenated amorphous InGaZnO thin film transistor", Appl. Phys. Lett. (Applied Physics Letters), 2011, vol. 98, No. 5, pp. 052102-1-052102-3.

Okamura.K et al., "Carrier transport in nanocrystalline field-effect transistors: Impact of interface roughness and geometrical carrier trap", Appl. Phys. Lett. (Applied Physics Letters), 2010, vol. 97, No. 15, pp. 153114-1-153114-3.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid Sate Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide-Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-

(56) References Cited

OTHER PUBLICATIONS

FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator" Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

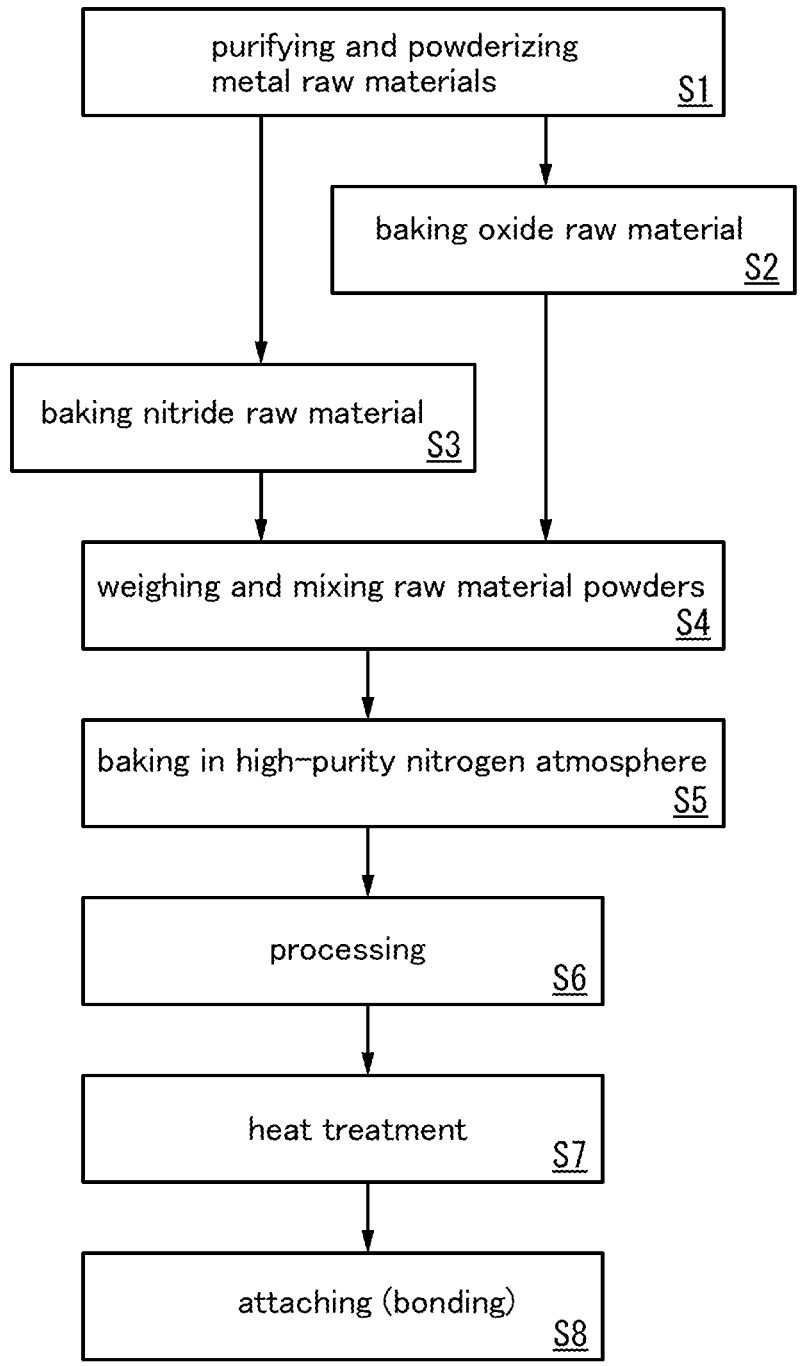

SPUTTERING TARGET, METHOD FOR MANUFACTURING THE SAME, AND METHOD FOR MANUFACTURING SEMICONDUCTOR DEVICE

CROSS-REFERENCE TO RELATED APPLICATIONS

This application is a divisional of U.S. application Ser. No. 13/323,930, filed Dec. 13, 2011, now allowed, which claims the benefit of a foreign priority application filed in Japan as Serial No. 2010-281429 on Dec. 17, 2010, both of which are incorporated by reference.

BACKGROUND OF THE INVENTION

1. Field of the Invention

The present invention relates to a sputtering target and a method for manufacturing the sputtering target. Further, the present invention relates to a method for manufacturing a semiconductor device with the use of the sputtering target. In this specification, a semiconductor device means a general device which can function by utilizing semiconductor characteristics, and an electro-optic device, a semiconductor circuit, and an electronic device are all semiconductor devices.

2. Description of the Related Art

A transistor formed over a flat plate such as a glass substrate, which is typically used in a liquid crystal display device, is generally formed using a semiconductor material such as amorphous silicon or polycrystalline silicon. A transistor manufactured using amorphous silicon has low field effect mobility, but can be formed over a larger glass substrate. In contrast, a transistor manufactured using polycrystalline silicon has high field effect mobility, but needs a crystallization step such as laser annealing and is not always suitable for a larger glass substrate.

Thus, a technique in which a transistor is manufactured using an oxide semiconductor as a semiconductor material and applied to an electronic device or an optical device has attracted attention. For example, Patent Document 1 and Patent Document 2 disclose techniques in which a transistor is formed using zinc oxide or an In—Ga—Zn—O-based compound as a semiconductor material and such a transistor is used as a switching element or the like of an image display device.

Note that in this specification, an $M_1$-$M_2$-$M_3$-O-based compound ($M_1$, $M_2$, and $M_3$ are metal elements) means a compound containing oxygen (i.e., an oxide) whose main components are the metal elements $M_1$, $M_2$, and $M_3$. At this time, there is no particular limitation on the ratios of $M_1$, $M_2$, $M_3$, and O unless otherwise specified. Further, the compound may contain an element other than $M_1$, $M_2$, $M_3$, and O as long as the element is not contained as a main component. Similarly, an $M_1$-$M_2$-$M_3$-O—N-based compound means a compound containing oxygen and nitrogen (i.e., an oxynitride) whose main components are the metal elements $M_1$, $M_2$, and $M_3$. There is no particular limitation on the ratios of $M_1$, $M_2$, $M_3$, O, and N. Definitions of a metal element, a main component, an oxide, and an oxynitride in this specification will be described later.

A transistor in which a channel formation region (also referred to as a channel region) is provided in an oxide semiconductor can have higher field effect mobility than a transistor using amorphous silicon. An oxide semiconductor film can be formed at a relatively low temperature by sputtering or the like, and a manufacturing process of a transistor using an oxide semiconductor is simpler than that of a transistor using polycrystalline silicon.

Transistors which are formed using such an oxide semiconductor over a glass substrate, a plastic substrate, or the like are expected to be applied to display devices such as a liquid crystal display, an electroluminescent display (also referred to as an EL display), and electronic paper (see Non-Patent Document 1).

It has been found that a crystal structure of a crystallized In—Ga—Zn—O-based compound is an $YbFe_2O_4$-type structure, an $Yb_2Fe_3O_7$-type structure, or a derivative structure thereof (see Non-Patent Document 2). It has been found that a material (an In—Ga—Zn—O—N-based compound) which is formed by substituting nitrogen for 7 atomic % or more of oxygen in an In—Ga—Zn—O-based compound and is crystallized has a wurtzite crystal structure (see Patent Document 3 and Patent Document 4).

Since an In—Ga—Zn—O—N-based compound has higher conductivity than an In—Ga—Zn—O-based compound, the use of the In—Ga—Zn—O—N-based compound as a material of source and drain electrodes or the like of a transistor has been proposed (see Patent Document 5).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2009-275236
[Patent Document 4] Japanese Published Patent Application No. 2010-114423
[Patent Document 5] Japanese Published Patent Application No. 2010-135774

Non-Patent Document

[Non-Patent Document 1] Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

SUMMARY OF THE INVENTION

However, In—Ga—Zn—O—N-based compounds which have been reported are formed by reactive sputtering. In reactive sputtering, an In—Ga—Zn—O-based compound is sputtered in an atmosphere containing nitrogen and as described below, a reduction in a deposition rate is caused.

Efficiency of sputtering is high when heavy atoms are used in an atmosphere (i.e., a sputtering gas). For example, in the case where argon with an atomic weight of 40 is used, a deposition rate and productivity are higher than those in the case where nitrogen with a molecular weight of 28 is used.

Thus, for higher productivity, the ratio of argon in an atmosphere at the time of sputtering needs to be increased so that the ratio of nitrogen in the atmosphere is relatively decreased. However, in the case of employing reactive sputtering, when the ratio of nitrogen in an atmosphere is decreased, the concentration of nitrogen in an In—Ga—Zn—O—N-based compound to be obtained becomes low, which prevents formation of a compound having a desired concentration of nitrogen in some cases. In particular, it is difficult to stably obtain an In—Ga—Zn—O—N-based compound whose concentration of nitrogen is 20 atomic % or more by reactive sputtering.

The above-described problem exists not only in an In—Ga—Zn—O—N-based compound but also in an In—Sn—Ga—Zn—O—N-based compound, an In—Sn—Zn—O—N-based compound, an In—Al—Zn—O—N-based compound, a Sn—Ga—Zn—O—N-based compound, an Al—Ga—Zn—O—N-based compound, a Sn—Al—Zn—O—N-based compound, an In—Zn—O—N-based compound, a Ga—Zn—O—N-based compound, a Sn—Zn—O—N-based compound, and an Al—Zn—O—N-based compound.

In particular, gallium and aluminum are easily combined with oxygen; thus, in formation of an oxynitride film by reactive sputtering with the use of an oxide containing gallium or aluminum, there is a great difficulty in substituting nitrogen for oxygen bonded to gallium or aluminum, so that the concentration of nitrogen becomes low.

An object of one embodiment of the present invention is to provide a method and a means for stably obtaining an oxynitride film containing nitrogen at a desired concentration, and articles and the like which are necessary for the method and means.

One embodiment of the present invention is a sputtering target which includes an oxynitride containing at least two elements selected from indium, gallium, zinc, and tin. Here, the concentration of nitrogen is preferably 4 atomic % or more, more preferably 20 atomic % or more.

Further, in the sputtering target, the concentration of an alkali metal is preferably $5 \times 10^{16}$ atoms/cm$^3$ or lower. In addition, in the above sputtering target, the concentration of hydrogen is preferably $1 \times 10^{19}$ atoms/cm$^3$ or lower, more preferably $1 \times 10^{18}$ atoms/cm$^3$ or lower, still more preferably lower than $1 \times 10^{16}$ atoms/cm$^3$.

More specifically, the concentration of sodium (Na) is preferably $5 \times 10^{16}$ atoms/cm$^3$ or lower, more preferably $1 \times 10^{16}$ atoms/cm$^3$ or lower, still more preferably $1 \times 10^{15}$ atoms/cm$^3$ or lower. The concentration of lithium (Li) is preferably $5 \times 10^{15}$ atoms/cm$^3$ or lower, more preferably $1 \times 10^{15}$ atoms/cm$^3$ or lower. The concentration of potassium (K) is preferably $5 \times 10^{15}$ atoms/cm$^3$ or lower, more preferably $1 \times 10^{15}$ atoms/cm$^3$ or lower.

The above concentrations of hydrogen and an alkali metal are measured by secondary ion mass spectroscopy (SIMS). It is known that it is difficult to obtain accurate data in the proximity of a surface of a sample or in the proximity of an interface between stacked materials formed using different components by the SIMS analysis in principle. Thus, in the case where the concentration distribution of a target element in an object in a thickness direction is measured, the smallest value in a region where the object exists, the value is not greatly changed, and a substantially constant level of strength can be obtained is employed.

Further, in the case where the thickness of the object is small, a region where a substantially constant level of strength can be obtained cannot be found in some cases due to the influence of an adjacent material. In this case, the smallest value in a region where the object exists is employed as the concentration of the targeted element.

Another embodiment of the present invention is a method for manufacturing a semiconductor device that includes a step of forming an oxynitride film over a substrate by sputtering with the use of the above-described sputtering target. In the step, the total percentage of argon, krypton, and xenon in a sputtering gas which is used is preferably 80% or more.

Further, another embodiment of the present invention is a method for manufacturing a sputtering target which includes an oxynitride containing indium, gallium, and zinc. The method includes a step of sintering a mixture of at least one of indium nitride, gallium nitride, and zinc nitride as a raw material and at least one of indium oxide, gallium oxide, and zinc oxide in a nitrogen atmosphere.

In a sputtering target obtained according to at least one of the above embodiments of the present invention, nitrogen at a necessary concentration can be secured in advance. Therefore, the ratio of a heavy rare gas such as argon in a sputtering gas can be increased and productivity can be higher. This is preferable so that a highly conductive oxynitride whose concentration of nitrogen is particularly 4 atomic % or more, especially 20 atomic % or more is efficiently obtained. Needless to say, nitrogen may be contained in an atmosphere at the time of sputtering.

Further, when the concentrations of impurities such as hydrogen, an alkali metal, and an alkaline earth metal in a sputtering target are reduced, the reliability of a semiconductor device to be obtained can be increased. In particular, the density of carriers in an oxide semiconductor film has an influence on the threshold voltage of a transistor including an oxide semiconductor.

The carriers in the oxide semiconductor film are also generated from impurities contained in the oxide semiconductor film. For example, impurities such as a compound containing a hydrogen atom typified by water ($H_2O$), a compound containing an alkali metal, or a compound containing an alkaline earth metal contained in the deposited oxide semiconductor film increase the carrier density of the oxide semiconductor film.

When a material containing Na among alkali metals is in contact with an oxide (e.g., silicon oxide), Na diffuses into the oxide and becomes Na$^+$. In addition, Na cuts a bond between a metal and oxygen or enters the bond in the oxide semiconductor. As a result, transistor characteristics deteriorate (e.g., the transistor becomes normally-on (the shift of threshold voltage to a negative side) or the mobility is decreased). In addition, this also causes variation in the characteristics.

Such a problem is significant especially in the case where the concentration of hydrogen in the oxide semiconductor is sufficiently low. Thus, the concentration of an alkali metal contained in a material close to the oxide semiconductor needs to be $5 \times 10^{16}$ atoms/cm$^3$ or lower in the case where the concentration of hydrogen in the oxide semiconductor is $5 \times 10^{19}$ atoms/cm$^3$ or lower, particularly $5 \times 10^{18}$ atoms/cm$^3$ or lower.

Specifically, an alkali metal, an alkaline earth metal, and hydrogen that are impurities in a sputtering target used for manufacture of an oxide semiconductor film are removed, whereby an oxide semiconductor film containing a small amount of those impurities can be deposited.

Further, those impurities need to be removed also from a film of another material which is close to the oxide semiconductor film (e.g., an insulating film or a conductive film). Therefore, it is preferable that the sputtering target of the oxynitride have a sufficiently low concentration of impurities.

Note that the above idea has not become general. For example, in Non-Patent Document 1, it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used.

However, such consideration is not appropriate. According to the findings obtained by the inventor, an alkali metal and an alkaline earth metal are adverse impurities for a transistor using an oxide semiconductor layer and are preferably contained as little as possible.

Note that as a result of research by the present inventor, it has been found that the electron affinity of an In—Ga—Zn—O—N-based compound increases as the concentration of nitrogen increases, and the electron affinity becomes approximately 5.6 electron volts when the concentration of nitrogen is 10 atomic % or more. Further, a band gap becomes smaller as the concentration of nitrogen increases, and the band gap becomes 2.8 electron volts or lower, or the band gap becomes 2.3 electron volts or lower according to the circumstances. Moreover, the In—Ga—Zn—O—N-based compound has been found to become a conductor or a semiconductor depending on the concentration of nitrogen. The results show that the work function of an In—Ga—Zn—O—N-based compound whose concentration of nitrogen is high is approximately 5.6 electron volts.

This is preferable particularly in the case of manufacturing a semiconductor device (e.g., a transistor) including an oxide semiconductor such as an In—Ga—Zn—O-based compound. For example, by taking advantage of a work function larger than those of metals which can be usually used, the threshold voltage of the transistor can be higher and the transistor can become normally off.

In general, in the case of an oxide semiconductor, separation between a source and a channel or between a drain and the channel that utilizes a p-n junction cannot be performed. Thus, even when a transistor is manufactured with the use of an oxide semiconductor, a considerable amount of current flows between a source and a drain despite a gate potential of 0 V, i.e., the transistor becomes normally on, especially in the case where the channel length is 1 μm or less. To suppress such normally-on characteristics, the work function of a material used for a gate needs to be increased and an In—Ga—Zn—O—N-based compound fits the purpose.

Further, since an In—Ga—Zn—O—N-based compound has excellent conductivity when the concentration of nitrogen therein is increased, the In—Ga—Zn—O—N-based compound can be used not only for a gate but also for a source electrode and a drain electrode. Specifically, the electron affinity of an In—Ga—Zn—O-based compound is approximately 4.3 electron volts, whereas the electron affinity (which is substantially the same as a work function) of an In—Ga—Zn—O—N-based compound is approximately 5.6 electron volts at a maximum, as described above; therefore, a difference of one electron volt or higher is formed in a junction between the In—Ga—Zn—O-based compound and the In—Ga—Zn—O—N-based compound.

Such a difference corresponds to a p-n junction in a general silicon MOS transistor, and is substantially the same as, specifically, a junction between a channel and an extension region of a silicon MOS transistor which is doped at a high concentration, which means that the difference is effective in suppressing a short channel effect. In a transistor in which an oxide semiconductor is used for a channel and the channel length is 20 nm or less, an In—Ga—Zn—O—N-based compound is preferably used for a material to be in contact with the channel.

Further, since an In—Ga—Zn—O—N-based compound exhibits characteristics as a doped semiconductor depending on the concentration of nitrogen, an electric field between a channel and source and drain electrodes of a transistor can be relieved by forming an In—Ga—Zn—O—N-based compound film between the channel and the source and drain electrodes.

The above-described effect is obtained not only in an In—Ga—Zn—O—N-based compound but also in oxynitrides such as an In—Sn—Ga—Zn—O—N-based compound, an In—Sn—Zn—O—N-based compound, an In—Al—Zn—O—N-based compound, a Sn—Ga—Zn—O—N-based compound, an Al—Ga—Zn—O—N-based compound, a Sn—Al—Zn—O—N-based compound, an In—Zn—O—N-based compound, a Ga—Zn—O—N-based compound, a Sn—Zn—O—N-based compound, an Al—Zn—O—N-based compound, an In—O—N-based compound, a Sn—O—N-based compound, a Ga—O—N-based compound, and a Zn—O—N-based compound.

BRIEF DESCRIPTION OF THE DRAWINGS

In the accompanying drawings:

FIG. 1 is a flow chart illustrating a method for manufacturing a sputtering target;

DETAILED DESCRIPTION OF THE INVENTION

Figure 2A:
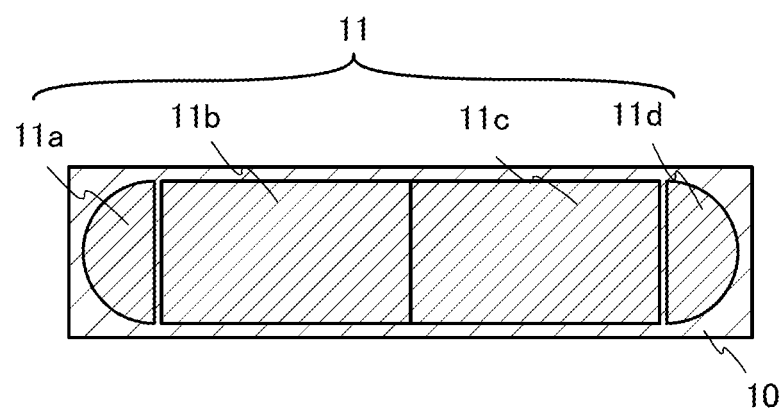
FIGS. 2A and 2B are top views illustrating a sputtering target.

Embodiments of the present invention will be described in detail below with reference to drawings. Note that the present invention is not limited to the following description and it will be easily understood by those skilled in the art that modes and details can be modified in various ways. In addition, the present invention is not construed as being limited to description of the embodiments. Furthermore, the methods and structures described in one of the following embodiments can be combined as appropriate with any of the methods and structures described in the other embodiments.

In describing structures of the present invention with reference to the drawings, the same reference numerals are used in common for the same portions in different drawings in some cases. Note that the same hatch pattern is applied to similar parts, and the similar parts are not especially denoted by reference numerals in some cases. Further, the ordinal numbers such as "first" and "second" in this specification are used for convenience and do not denote the order of steps or the stacking order of layers. In addition, the ordinal numbers in this specification do not denote particular names which specify the present invention.

An oxide in this specification is a substance (including a compound) in which the percentage of nitrogen, oxygen, fluorine, sulfur, selenium, chlorine, bromine, tellurium, and iodine is 25 atomic % or more of the total and the percentage of oxygen to the above elements is 70 atomic % or more; and an oxynitride in this specification is a substance (including a compound) in which the percentage of nitrogen, oxygen, fluorine, sulfur, selenium, chlorine, bromine, tellurium, and iodine is 25 atomic % or more of the total and the total percentage of oxygen and nitrogen to the above elements is 70 atomic % or more.

A metal element in this specification refers to all elements other than a rare gas element, hydrogen, boron, carbon, nitrogen, a Group 16 element (e.g., oxygen), a Group 17 element (e.g., fluorine), silicon, phosphorus, germanium, arsenic, and antimony.

Further, in this specification, the expression "one metal element is a main metal component" indicates the case where among one or more metal elements in a substance, the percentage of the metal element exceeds 50 atomic % of the total percentage of the metal elements. In addition, "n metal elements $M_1, M_2, \ldots M_n$ are main metal components" indicates the case where the total percentage of the metal elements $M_1, M_2, \ldots M_n$ exceeds $\{(1-2^{-n}) \times 100\}$ [atomic %] of the total percentage of the metal elements.

Embodiment 1

In this embodiment, a method for manufacturing a sputtering target which is one embodiment of the present invention will be described with reference to FIG. 1. FIG. 1 is a flow chart illustrating an example of a method for manufacturing a sputtering target according to this embodiment. Although manufacture of a sputtering target of an In—Ga—Zn—O—N-based compound is described below, manufacture of a sputtering target of another oxynitride can be performed similarly.

Here, a case is described where a sputtering target is formed by baking indium nitride, gallium nitride, indium oxide, gallium oxide, and zinc oxide as raw materials. First, zinc, indium, and gallium are each purified by repeating distillation, sublimation, or recrystallization. The purity of each of the materials is made 99.99% or more, preferably 99.9999% or more. After that, the purified metals are each processed into a powder form (S1).

Metal zinc, metal indium, and metal gallium which are highly purified in this manner are oxidized by baking in a high-purity oxygen atmosphere, so that oxide raw materials are obtained (S2). The purity of the oxygen atmosphere is, for example, 6N (99.9999%) or more, preferably 7N (99.99999%) or more (i.e., the concentration of impurities is 1 ppm or lower, preferably 0.1 ppm or lower).

On the other hand, part of the highly purified metal indium and metal gallium are nitrided by baking in a high-purity nitrogen atmosphere or a high-purity ammonia atmosphere, so that nitride raw materials are obtained (S3). The purity of the nitrogen or ammonia atmosphere is, for example, 6N (99.9999%) or more, preferably 7N (99.99999%) or more. Note that when ammonia is used, it is preferable that heat treatment be sufficiently performed later in a high-purity nitrogen atmosphere or a high-purity rare gas atmosphere, whereby hydrogen is eliminated. Further, since indium nitride reacts with moisture in the air and is decomposed to indium oxide, treatment in a later step is preferably performed in a hermetically sealed environment.

Then, each of the oxide powders and the nitride powders is weighed as appropriate, and the weighed powders are mixed (S4). For example, the powders are mixed at a ratio of $InN:In_2O_3:GaN:Ga_2O_3:ZnO=2:1:2:1:4$ (molar ratio) or a ratio of $In_2O_3:GaN:Ga_2O_3:ZnO=2:2:1:4$ (molar ratio). In each case, the metal elements are contained in the mixture at a ratio of In:Ga:Zn=1:1:1 (atomic ratio); however, needless to say, the present invention is not limited to the above ratios.

Then, the mixture is baked in a high-purity nitrogen atmosphere with a purity of 6N (99.9999%) or more, preferably 7N (99.99999%) or more (S5). As a result of baking of the mixture, hydrogen, moisture, hydrocarbon, or the like can be eliminated from the mixture. Baking can also be performed in a vacuum or a reduced-pressure atmosphere. Alternatively, baking can be performed after or with application of mechanical pressure. Thus, a sintered body is obtained. Note that it is preferable that pressure be adjusted such that the filling rate of the sintered body becomes greater than or equal to 90% and less than or equal to 100%, preferably greater than or equal to 95% and less than or equal to 99.9%.

As a baking method other than the above-described method, an atmospheric baking method, a pressure sintering method, or the like can be used as appropriate. As the pressure sintering method, a hot pressing method, a hot isostatic pressing (HIP) method, a discharge plasma sintering method, or an impact method is preferably used. Although the maximum temperature of baking depends on the composition of the material, it is preferably set to approximately 1000° C. to 2000° C., more preferably 1200° C. to 1500° C. Although the holding time of the maximum temperature depends on the composition of the material, 0.5 hours to 3 hours is preferable.

Next, the sintered body is subjected to mechanical processing in order that a sputtering target having a desired size, a desired shape, and desired surface roughness be formed (S6). As a processing means, for example, mechanical polishing or chemical mechanical polishing (CMP) can be used. Alternatively, these methods can be employed in combination.

In order to remove minute dust generated by the mechanical processing and components of a grinding solution, cleaning may be performed. For example, the processed sintered body may be cleaned by ultrasonic cleaning in which the sintered body is soaked in an organic solvent, or the like. Note that cleaning without use of water is preferable. Specifically, an oxynitride which contains zinc and/or indium as in this embodiment easily reacts with water; thus, attention needs to be paid to the cleaning.

Then, heat treatment is performed on the sintered body (S7). The heat treatment is preferably performed in an inert gas atmosphere (a nitrogen atmosphere or a rare gas atmosphere). Although the temperature of the heat treatment depends on the composition of the material of the sintered body, it is set to a temperature at which the property of the material is not changed. Specifically, the temperature is higher than or equal to 150° C. and lower than or equal to 750° C., preferably higher than or equal to 425° C. and lower than or equal to 750° C. Heating time is, specifically, 0.5 hours or longer, preferably an hour or longer. The heat treatment may be performed in a vacuum or in a high-pressure atmosphere.

After that, the sintered body is attached to a metal plate called a backing plate (bonding), so that a sputtering target is completed (S8). A backing plate has functions of cooling the sputtering target and being an electrode and thus is preferably formed using copper, which is excellent in thermal conductivity and electric conductivity. Alternatively, titanium, a copper alloy, a stainless steel alloy, or the like can be used other than copper.

Figure 2B:
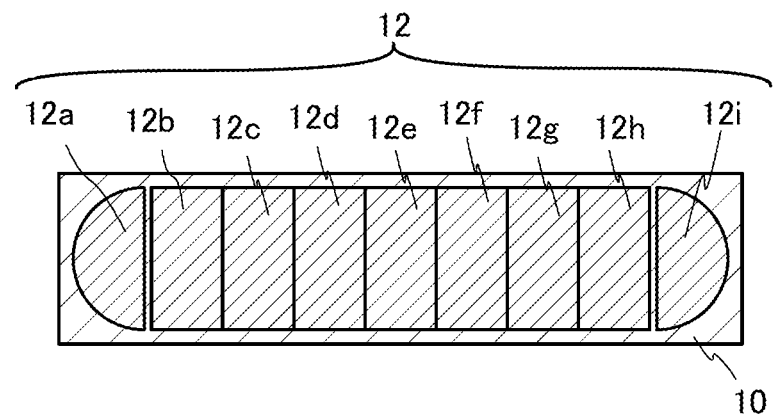

Further, at the time of bonding the sintered body to the backing plate, it is also possible that the sintered body that is divided is bonded to one backing plate or that the plurality of sintered bodies are bonded to one backing plate. FIGS. 2A and 2B illustrate examples in which the sintered body is divided and bonded to one backing plate.

FIG. 2A illustrates an example in which a sintered body 11 is divided into four sintered bodies 11a, 11b, 11c, and 11d and they are bonded to a backing plate 10. FIG. 2B illustrates an example in which one sintered body is divided into a larger number of sintered bodies and bonded to a backing plate; that is, a sintered body 12 is divided into nine sintered bodies 12a, 12b, 12c, 12d, 12e, 12f, 12g, 12h, and 12i, and they are bonded to the backing plate 10.

Note that the number of divided sintered bodies and the shape of the sintered body or the target are not limited to the number and the shape in the case of FIG. 2A or FIG. 2B. When the sintered body is divided, deformation (warpage or strain, or chipping or cracking due to the warpage or strain) of the sintered body at the time of being bonded to the backing plate or at the time of being used can be relaxed. A sputtering target including such divided sintered bodies can be favorably used particularly for a large-sized sputtering apparatus. Needless to say, one sputtering target may be bonded to one backing plate.

It is preferable that the sputtering target be transferred, stored, and the like in a high-purity oxygen gas atmosphere, a high-purity nitrogen gas atmosphere, a high-purity $N_2O$ gas atmosphere, or an ultra dry air (having a dew point of $-40°$ C. or lower, preferably $-60°$ C. or lower) atmosphere, in order to prevent re-entry of impurities such as moisture, hydrogen, or an alkali metal.

The target may be covered with a protective material formed of a material with low water permeability such as a stainless steel alloy, and the above gas may be introduced into a gap between the protective material and the target. It is preferable that the oxygen gas and the $N_2O$ gas do not contain water, hydrogen, and the like. Alternatively, the purity of the oxygen gas, the nitrogen gas, or the $N_2O$ gas is preferably 6N (99.9999%) or more, more preferably 7N (99.99999%) or more.

Through the above process, the sputtering target described in this embodiment can be manufactured. The sputtering target in this embodiment can contain a small amount of impurities by using the materials each of which is purified to have high purity in the manufacturing process. Further, the concentration of impurities contained in an oxide semiconductor film which is formed using the target can also be reduced.

Although a method for manufacturing a sputtering target for an In—Ga—Zn—O—N-based compound is described in this embodiment, a sputtering target for an In—Sn—Ga—Zn—O—N-based compound, a sputtering target for an In—Sn—Zn—O—N-based compound, a sputtering target for an In—Al—Zn—O—N-based compound, a sputtering target for a Sn—Ga—Zn—O—N-based compound, a sputtering target for an Al—Ga—Zn—O—N-based compound, a sputtering target for a Sn—Al—Zn—O—N-based compound, a sputtering target for an In—Zn—O—N-based compound, a sputtering target for a Sn—Zn—O—N-based compound, a sputtering target for an Al—Zn—O—N-based compound, or the like can also be manufactured in a similar manner.

Further, although indium nitride and gallium nitride are used as nitrides in this embodiment, it is also possible to use zinc nitride. Zinc nitride can be obtained by heating zinc powder in an ammonia atmosphere. Note that since zinc nitride also reacts with water and is decomposed in a manner similar to that of indium nitride, zinc nitride is preferably handled in an inert gas.

In the manufacture of the sputtering target, the series of steps is preferably conducted in a high-purity inert gas atmosphere (a nitrogen atmosphere or a rare gas atmosphere), a high-purity oxygen atmosphere, or a mixed atmosphere of a high-purity inert gas and high-purity oxygen, without exposure to the air. Note that the sputtering target is set in a sputtering apparatus in an inert gas atmosphere (a nitrogen atmosphere or a rare gas atmosphere) or the like without exposure to the air, whereby hydrogen, moisture, an alkali metal, or the like can be prevented from attaching to the sputtering target.

Further, after the sputtering target is set in the sputtering apparatus, heat treatment is preferably performed to remove hydrogen or water which remain on a surface of or inside the target material. As the heat treatment, a method in which the inside of the deposition chamber is heated to $200°$ C. to $600°$ C. under reduced pressure, a method in which introduction and removal of nitrogen or an inert gas are repeated while the inside of the deposition chamber is heated, and the like can be given.

Moreover, as for the sputtering apparatus in which the sputtering target is to be set, it is preferable that the leakage rate be $1\times10^{-10}$ $Pa \cdot m^3/s$ or lower, entry of water into a film to be manufactured be reduced with the use of a cryopump as an evacuation means, and a device that prevents counter flow be provided.

Embodiment 2

In this embodiment, one embodiment of a semiconductor device and a method for manufacturing the semiconductor device will be described with reference to FIGS. 3A to 3C, FIGS. 4A and 4B, and FIGS. 5A to 5E.

Figure 3A:
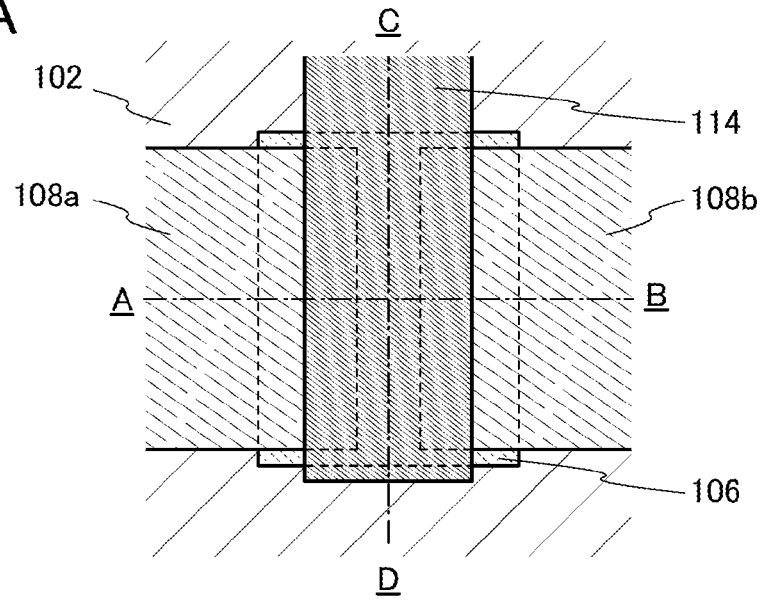
FIGS. 3A to 3C are a top view and cross-sectional views illustrating one mode of a semiconductor device that is one embodiment of the present invention.
Figure 3B:
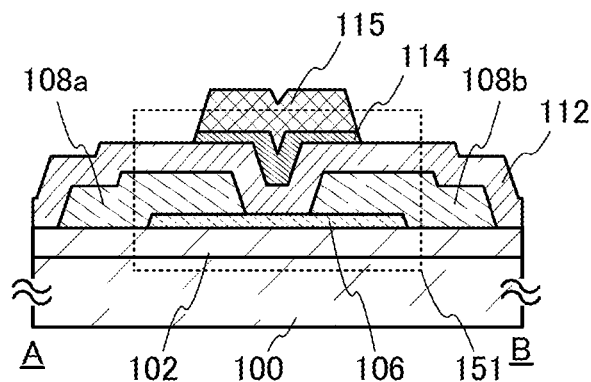
Figure 3C:
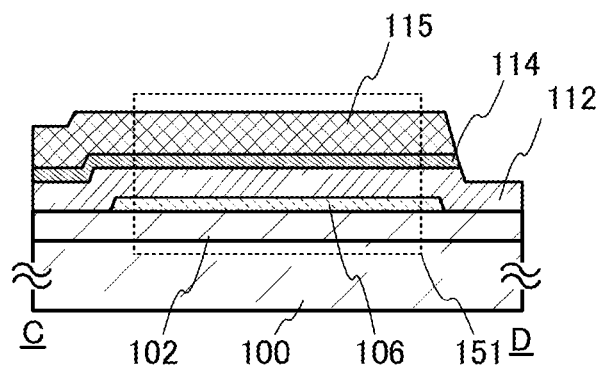

FIGS. 3A to 3C are a top view and cross-sectional views illustrating a transistor 151 which is a top-gate top-contact type as an example of a semiconductor device according to one embodiment of the present invention. Here, FIG. 3A is a top view, FIG. 3B is a cross-sectional view along A-B of FIG. 3A, and FIG. 3C is a cross-sectional view along C-D of FIG. 3A. Note that in FIG. 3A, some of components of the transistor 151 (for example, a gate insulating layer 112) are omitted for brevity.

The transistor 151 in FIGS. 3A to 3C includes an insulating layer 102, an oxide semiconductor layer 106, a source electrode 108a, a drain electrode 108b, the gate insulating layer 112, a first gate electrode layer 114, and a second gate electrode layer 115 over a substrate 100.

The first gate electrode layer 114 is in contact with the gate insulating layer 112 and is formed using an In—Ga—Zn—O—N-based compound which contains indium and nitrogen and whose band gap is lower than 2.8 eV, preferably lower than 2.3 eV, and the thickness thereof is greater than or equal to 5 nm and less than or equal to 200 nm.

The above In—Ga—Zn—O—N-based compound has less conductivity than a metal; therefore, the second gate electrode layer 115 is preferably provided using a metal, a metal nitride, or the like with preferable conductivity over the first gate electrode layer 114. Needless to say, when sufficient conductivity can be obtained with the first gate electrode layer 114, the second gate electrode layer 115 is not necessarily provided.

When the thickness of the first gate electrode layer 114 is less than 5 nm, characteristics of a transistor are affected not by the work function of the above In—Ga—Zn—O—N-based compound but by the work function of the second gate electrode layer 115; therefore, it is not preferable that the thickness of the first gate electrode layer 114 be less than 5 nm.

As a material of the insulating layer 102, silicon oxide, silicon oxynitride, aluminum oxide, a mixed material of any of them, or the like may be used. Alternatively, the insulating layer 102 may be formed using a stacked layer of the above material and silicon oxide, silicon nitride, silicon oxynitride, silicon nitride oxide, aluminum oxide, aluminum nitride, a mixed material of any of them, or the like.

For example, when the insulating layer 102 has a stacked-layer structure of a silicon nitride layer and a silicon oxide layer, entry of moisture from the substrate 100 or the like into the transistor 151 can be prevented. In the case where the insulating layer 102 is formed to have a stacked-layer structure, an oxide layer of silicon oxide, silicon oxynitride, aluminum oxide, a mixed material of any of them, or the like is preferably formed on a side where the insulating layer 102 is in contact with the oxide semiconductor layer 106.

Note that the insulating layer 102 functions as a base layer of the transistor 151. The insulating layer 102 is preferably an insulating layer from which oxygen can be released by heating. "Being possible to release oxygen" means that the released amount of $O_2$ is $1 \times 10^{18}$ atoms/cm$^3$ or higher, preferably $3 \times 10^{20}$ atoms/cm$^3$ or higher.

As a material used for the oxide semiconductor layer 106, an In—Sn—Ga—Zn—O-based compound, which is a four-component metal oxide; an In—Ga—Zn—O-based compound, an In—Sn—Zn—O-based compound, an In—Al—Zn—O-based compound, a Sn—Ga—Zn—O-based compound, an Al—Ga—Zn—O-based compound, or a Sn—Al—Zn—O-based compound, which are three-component metal oxides; an In—Zn—O-based compound, a Sn—Zn—O-based compound, an Al—Zn—O-based compound, a Zn—Mg—O-based compound, a Sn—Mg—O-based compound, an In—Mg—O-based compound, or an In—Ga—O-based compound, which are two-component metal oxides; an In—O-based compound; a Sn—O-based compound; a Zn—O-based compound; or the like can be used. In addition, any of the above materials may contain silicon oxide.

In this embodiment, an In—Ga—Zn—O-based compound is used as the oxide semiconductor. In other words, the oxide semiconductor is formed by sputtering using an In—Ga—Zn—O-based compound as a sputtering target.

When the oxide semiconductor layer 106 and the insulating layer 102 which is a base are in contact with each other, an interface state between the insulating layer 102 and the oxide semiconductor layer 106 and oxygen deficiency in the oxide semiconductor layer 106 can be reduced. By the above reduction of the interface state, the fluctuation in threshold voltage when a high voltage is applied to the gate electrode can be reduced.

The gate insulating layer 112 can have a structure similar to that of the insulating layer 102, and is preferably an insulating layer from which oxygen can be released by heating. At this time, a material having a high dielectric constant, such as hafnium oxide or aluminum oxide, may be used for the gate insulating layer 112 considering the func- tion of the gate insulating layer of the transistor. Alternatively, a stacked layer of silicon oxide, silicon oxynitride, or silicon nitride and a material having a high dielectric constant, such as hafnium oxide or aluminum oxide, may be used considering a gate withstand voltage and a state of an interface between the oxide semiconductor and the gate insulating layer 112.

A protective insulating layer may be further provided over the transistor 151. The protective insulating layer can have a structure similar to that of the insulating layer 102. For example, a stacked-layer structure of silicon oxide with a thickness of 200 nm to 500 nm and aluminum oxide with a thickness of 10 nm to 50 nm is preferably employed. In order to electrically connect the source electrode 108*a* or the drain electrode 108*b* and a wiring, an opening may be formed in the insulating layer 102, the gate insulating layer 112, and the like. Another gate electrode may be further provided below the oxide semiconductor layer 106. Note that it is not always necessary but preferable that the oxide semiconductor layer 106 has an island shape.

Figure 4A:
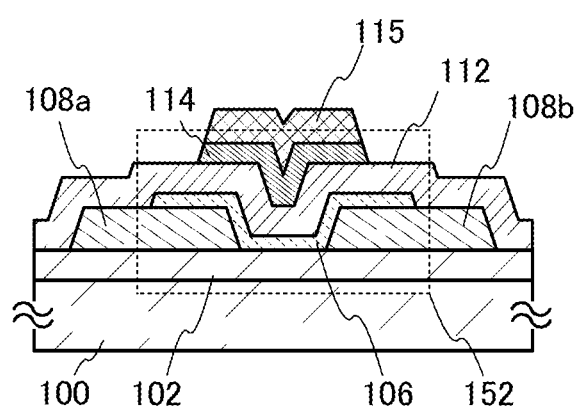
FIGS. 4A and 4B are cross-sectional views each illustrating one mode of a semiconductor device that is one embodiment of the present invention.
Figure 4B:
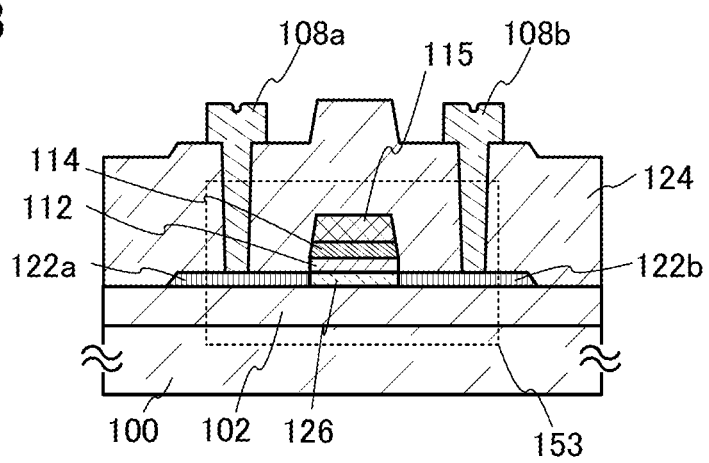

FIGS. 4A and 4B illustrate cross-sectional structures of transistors having structures different from that of the transistor 151. A transistor 152 in FIG. 4A is the same as the transistor 151 in that it includes the insulating layer 102, the oxide semiconductor layer 106, the source electrode 108*a*, the drain electrode 108*b*, the gate insulating layer 112, the first gate electrode layer 114, and the second gate electrode layer 115.

The differences between the transistor 152 and the transistor 151 are the positions where the oxide semiconductor layer 106 is connected to the source electrode 108*a* and the drain electrode 108*b*. That is, in the transistor 152, the source electrode 108*a* and the drain electrode 108*b* are in contact with bottom portions of the oxide semiconductor layer 106. The other components are similar to those of the transistor 151 in FIGS. 3A to 3C.

The transistor 153 in FIG. 4B is the same as the transistor 151 and the transistor 152 in that it includes the insulating layer 102, the gate insulating layer 112, the first gate electrode layer 114, the second gate electrode layer 115, the source electrode 108*a*, and the drain electrode 108*b*.

The transistor 153 is different from the transistor 151 and the transistor 152 in that a channel region 126, a source region 122*a*, and a drain region 122*b* are formed in the oxide semiconductor layer in the same plane. The source region 122*a* and the drain region 122*b* are connected to the source electrode 108*a* and the drain electrode 108*b*, respectively, through openings provided in a protective insulating layer 124.

The insulating layer 102 which is the base of the transistor 153 can have the same structure as the insulating layer 102 of the transistor 151. After the oxide semiconductor layer is formed, the gate insulating layer 112, the first gate electrode layer 114, and the second gate electrode layer 115 are formed. The first gate electrode layer 114, the second gate electrode layer 115, and the gate insulating layer 112 can be formed by processing using the same mask. Alternatively, after the first gate electrode layer 114 and the second gate electrode layer 115 are formed by processing, the gate insulating layer 112 may be formed by processing with the use of the first gate electrode layer 114 and the second gate electrode layer 115 as masks.

In addition, the source region 122*a* and the drain region 122*b* are formed in such a manner that the resistance of the oxide semiconductor layer is reduced using the first gate electrode layer 114 and the second gate electrode layer 115 as masks. A region existing under the first gate electrode layer 114 becomes the channel region 126.

An example of a manufacturing process of the transistor 151 in FIGS. 3A to 3C will be described below with reference to FIGS. 5A to 5E.

Figure 5A:
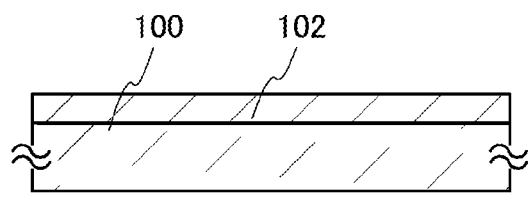
FIGS. 5A to 5E are cross-sectional views illustrating an example of a manufacturing process of a semiconductor device that is one embodiment of the present invention.

First, the insulating layer 102 is formed over the substrate 100 (see FIG. 5A). The insulating layer 102 is preferably an insulating layer from which oxygen can be released by heating.

There is no particular limitation on the property of a material and the like of the substrate 100 as long as the material has heat resistance enough to withstand at least heat treatment to be performed later. For example, a glass substrate, a ceramic substrate, a quartz substrate, a sapphire substrate, or the like can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

In the case where unfavorable impurities for a transistor are contained in a substrate, it is preferable that a film formed of an insulating material (e.g., aluminum nitride, aluminum oxide, or silicon nitride) having a function of blocking the impurities be provided on a surface.

As a method for forming the insulating layer 102, a plasma CVD method or sputtering can be employed, for example. As a material of the insulating layer 102, silicon oxide, silicon oxynitride, aluminum oxide, a mixed material of any of them, or the like may be used. Alternatively, the insulating layer 102 may be formed using a stacked layer of the above material and silicon oxide, silicon nitride, silicon oxynitride, silicon nitride oxide, aluminum oxide, aluminum nitride, a mixed material of any of them, or the like.

In the case where the insulating layer 102 is formed to have a stacked-layer structure, an oxide layer of silicon oxide, silicon oxynitride, aluminum oxide, a mixed material of any of them, or the like is preferably formed on a side where the insulating layer 102 is in contact with the oxide semiconductor layer 106. The total thickness of the insulating layer 102 is preferably 20 nm or more, more preferably 100 nm or more.

For example, a silicon oxide film is formed by an RF sputtering method under the following conditions: quartz (preferably synthetic quartz) is used as a sputtering target; the substrate temperature is higher than or equal to 30° C. and lower than or equal to 450° C. (preferably higher than or equal to 70° C. and lower than or equal to 200° C.); the distance between the substrate and the sputtering target is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa); the high-frequency power is higher than or equal to 0.5 kW and lower than or equal to 12 kW (preferably higher than or equal to 1 kW and lower than or equal to 5 kW); and the proportion of $O_2/(O_2+Ar)$ in the deposition gas is greater than or equal to 1% and less than or equal to 100% (preferably greater than or equal to 6% and less than or equal to 100%).

Figure 5B:
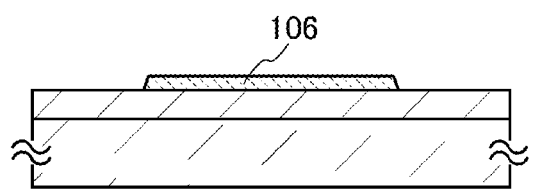

Next, an oxide semiconductor layer is formed over the insulating layer 102 and then is processed to form the oxide semiconductor layer 106 having an island shape (see FIG. 5B). Note that the insulating layer 102 and the oxide semiconductor layer 106 are preferably formed successively without exposure to the air. For example, the oxide semiconductor layer can be formed by sputtering, a vacuum evaporation method, a pulsed laser deposition method, a CVD method, or the like. In this embodiment, the oxide semiconductor layer is formed by sputtering using a sputtering target of an In—Ga—Zn—O-based compound. The thickness of the oxide semiconductor layer is preferably greater than or equal to 3 nm and less than or equal to 50 nm As the sputtering target of an In—Ga—Zn—O-based compound, for example, an oxide sputtering target having a composition ratio of In:Ga:Zn=1:1:1 [molar ratio] can be used. Note that it is not necessary to limit the material and the composition of the sputtering target to the above. For example, an oxide sputtering target having a composition ratio of In:Ga:Zn=2:2:1 [molar ratio] can be used.

The relative density of the sputtering target is higher than or equal to 90% and lower than or equal to 100%, preferably higher than or equal to 95% and lower than or equal to 99.9%. This is because, with the use of the sputtering target with a high relative density, a dense oxide semiconductor layer can be formed.

The deposition atmosphere may be a rare gas (typically argon) atmosphere, an oxygen atmosphere, a mixed atmosphere containing a rare gas and oxygen, or the like. Moreover, it is preferable to use an atmosphere using a high-purity gas in which impurities such as hydrogen, water, a hydroxyl group, and a hydride are sufficiently removed so that entry of hydrogen, water, a hydroxyl group, and a hydride into the oxide semiconductor layer can be prevented.

An example of the deposition conditions is as follows: the distance between the substrate and the sputtering target is 60 mm; the pressure is 0.4 Pa; the direct-current (DC) power is 0.5 kW; and the deposition atmosphere is a mixed atmosphere containing argon and oxygen (the proportion of the oxygen flow is 33%). Note that a pulsed DC sputtering method is preferable because powder substances (also referred to as particles or dust) generated in the deposition can be reduced and the film thickness can be uniform.

In this case, when the substrate temperature is higher than or equal to 100° C. and lower than or equal to 450° C., preferably higher than or equal to 150° C. and lower than or equal to 350° C., oxygen is released from the insulating layer 102, whereby oxygen deficiency in the oxide semiconductor layer and an interface state between the insulating layer 102 and the oxide semiconductor layer can be reduced.

Note that before the oxide semiconductor layer 106 is formed by sputtering, a substance attached to a surface where the oxide semiconductor layer is to be formed (e.g., a surface of the insulating layer 102) may be removed by reverse sputtering in which an argon gas is introduced and plasma is generated.

Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near an object to be processed. Note that an atmosphere of nitrogen, helium, oxygen, or the like may be used instead of an argon atmosphere.

The oxide semiconductor layer 106 can be processed by etching after a mask having a desired shape is formed over the oxide semiconductor layer. The mask can be formed by a method such as photolithography. Alternatively, the mask may be formed by an ink-jet method or the like.

For the etching of the oxide semiconductor layer, either wet etching or dry etching may be employed. It is needless to say that both of them may be employed in combination.

After that, heat treatment (first heat treatment) is preferably performed on the oxide semiconductor layer 106. By the first heat treatment, excessive hydrogen (including water and a hydroxyl group) in the oxide semiconductor layer 106 can be removed and a structure of the oxide semiconductor can be ordered. The temperature of the first heat treatment is higher than or equal to 100° C. and lower than or equal to 650° C. or lower than the strain point of the substrate, preferably higher than or equal to 250° C. and lower than or equal to 600° C. The atmosphere of the first heat treatment is an oxidizing gas atmosphere or an inert gas atmosphere.

Note that an inert gas atmosphere is an atmosphere that contains nitrogen or a rare gas (e.g., helium, neon, or argon) as its main component and it is preferable that the inert gas atmosphere do not contain water, hydrogen, and the like. For example, the purity of nitrogen or a rare gas such as helium, neon, or argon introduced into a heat treatment apparatus is set to 6N (99.9999%) or more, preferably 7N (99.99999%) or more (i.e., the concentration of impurities is 1 ppm or lower, preferably 0.1 ppm or lower). The inert gas atmosphere is an atmosphere that contains an inert gas as its main component and contains a reactive gas at lower than 10 ppm.

Note that the oxidizing gas is oxygen, ozone, nitrogen dioxide, or the like, and it is preferable that the oxidizing gas do not contain water, hydrogen, and the like. For example, the purity of oxygen, ozone, or nitrogen dioxide introduced into a heat treatment apparatus is set to 6N (99.9999%) or more, preferably 7N (99.99999%) or more (i.e., the concentration of impurities is 1 ppm or lower, preferably 0.1 ppm or lower). As the oxidizing gas atmosphere, an atmosphere in which an oxidizing gas is mixed with an inert gas may be used, and the oxidizing gas is contained at least at 10 ppm in the atmosphere.

By the first heat treatment, oxygen is released from the insulating layer 102, whereby the interface state between the insulating layer 102 and the oxide semiconductor layer 106 and the oxygen deficiency in the oxide semiconductor layer 106 can be reduced. By the above reduction of the interface state, the fluctuation in threshold voltage when a high voltage is applied to the gate can be reduced and a highly reliable transistor can be obtained.

Further, in general, it is known that the oxygen deficiency in the oxide semiconductor becomes donors and the source for generating electrons which are carriers. When the oxygen deficiency in the oxide semiconductor layer 106 is compensated, the concentration of the donors can be reduced.

The heat treatment can be performed in such a manner that, for example, an object to be processed is introduced into an electric furnace in which a resistance heating element or the like is used and heated at 350° C. in a nitrogen atmosphere for an hour. During the heat treatment, the oxide semiconductor layer is not exposed to the air to prevent the entry of water and hydrogen.

The heat treatment apparatus is not limited to an electric furnace, and may include a device for heating an object to be processed by heat conduction or heat radiation from a medium such as a heated gas. For example, a rapid thermal anneal (RTA) apparatus such as a gas rapid thermal anneal (GRTA) apparatus or a lamp rapid thermal anneal (LRTA) apparatus can be used.

An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high temperature gas. As the high temperature gas, used is an inert gas which does not react with an object to be processed in heat treatment, such as nitrogen or a rare gas like argon.

For example, as the first heat treatment, GRTA treatment may be performed as follows. The object to be processed is put in an inert gas atmosphere that has been heated, heated for several minutes, and then taken out of the inert gas atmosphere. GRTA treatment enables high-temperature heat treatment in a short time. Moreover, GRTA treatment can be employed even when the temperature exceeds the upper temperature limit of the object. Note that the inert gas atmosphere may be switched to an atmosphere containing an oxidizing gas during the treatment.

This is because by performing the first heat treatment in an atmosphere containing the oxidizing gas, oxygen deficiency in the oxide semiconductor layer 106 can be compensated and defect levels in an energy gap due to oxygen deficiency can be reduced. Such heat treatment may be performed once or plural times.

Note that the case is described here in which the first heat treatment is performed after the oxide semiconductor layer 106 having an island shape is formed by processing; however, one embodiment of the present invention is not limited thereto. The oxide semiconductor layer 106 may be formed in such a manner that the oxide semiconductor layer is subjected to the first heat treatment and then etched.

Figure 5C:
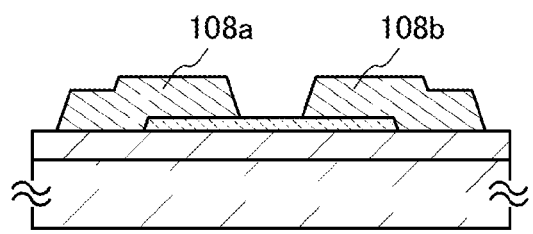

Next, a conductive layer for forming of the source electrode and the drain electrode (including a wiring formed in the same layer as the source electrode and the drain electrode) is formed over the insulating layer 102 and the oxide semiconductor layer 106 and processed to form the source electrode 108a and the drain electrode 108b (see FIG. 5C). The channel length L of the transistor depends on the distance between the edges of the source electrode 108a and the drain electrode 108b which are formed here.

As the conductive layer used for the source electrode 108a and the drain electrode 108b, for example, a metal layer containing an element selected from aluminum, chromium, copper, tantalum, titanium, molybdenum, and tungsten, or a metal nitride layer containing any of the above elements as its component (e.g., a titanium nitride layer, a molybdenum nitride layer, or a tungsten nitride layer) can be used. A high-melting-point metal layer of titanium, molybdenum, tungsten, or the like or a metal nitride layer of any of these elements (a titanium nitride layer, a molybdenum nitride layer, or a tungsten nitride layer) may be stacked on one of or both a bottom side and a top side of a metal layer of aluminum, copper, or the like.

Alternatively, the conductive layer used for the source electrode 108a and the drain electrode 108b may be formed using a conductive metal oxide or a conductive metal nitride. As the conductive metal oxide, indium oxide ($In_2O_3$), tin oxide ($SnO_2$), zinc oxide (ZnO), an indium oxide-tin oxide alloy ($In_2O_3$—$SnO_2$; abbreviated to ITO), an indium oxide-zinc oxide alloy ($In_2O_3$—ZnO), or any of these metal oxide materials containing silicon oxide can be used.

Note that in etching of the conductive layer, part of the oxide semiconductor layer 106 is etched, so that the oxide semiconductor layer having a groove (a recessed portion) is formed in some cases.

After that, by plasma treatment using a gas such as oxygen, ozone, or nitrogen dioxide, a surface of an exposed portion of the oxide semiconductor layer 106 may be oxidized and oxygen deficiency may be compensated. In the case where plasma treatment is performed, the gate insulating layer 112 which is to be in contact with part of the oxide semiconductor layer 106 is preferably formed without being exposed to the air, following the plasma treatment.

Figure 5D:
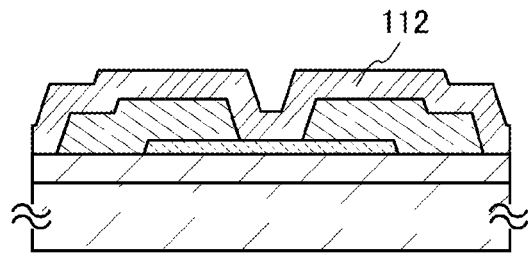

Next, the gate insulating layer 112 is formed so as to cover the source electrode 108a and the drain electrode 108b and to be in contact with part of the oxide semiconductor layer 106 (see FIG. 5D).

The gate insulating layer 112 can have a structure similar to that of the insulating layer 102. Note that a material having a high dielectric constant, such as hafnium oxide or aluminum oxide, may be used for the gate insulating layer 112 considering the function of the gate insulating layer of the transistor. Alternatively, a stacked layer of silicon oxide, silicon oxynitride, or silicon nitride and a material having a high dielectric constant, such as hafnium oxide or aluminum oxide, may be used considering a gate withstand voltage and a state of an interface between the oxide semiconductor and the gate insulating layer 112.

The total thickness of the gate insulating layer 112 is preferably greater than or equal to 1 nm and less than or equal to 300 nm, more preferably greater than or equal to 5 nm and less than or equal to 50 nm. As the thickness of the gate insulating layer is larger, the higher voltage can be applied to a gate electrode but on the other hand, a short channel effect occurs more easily and the threshold voltage tends to shift to a negative direction. In addition, it is found that when the thickness of the gate insulating layer is 5 nm or less, leakage due to a tunnel current is increased.

Second heat treatment is preferably performed after the gate insulating layer 112 is formed. The second heat treatment is performed at a temperature of higher than or equal to 250° C. and lower than or equal to 700° C., preferably higher than or equal to 350° C. and lower than or equal to 600° C. Needless to say, the temperature may be changed considering characteristics of a substrate or a deposited material.

The second heat treatment may be performed in an atmosphere of an oxidizing gas or an inert gas. Note that it is preferable that water, hydrogen, and the like be not contained in the atmosphere of an oxidizing gas or an inert gas. Further, the purity of the gas introduced into a heat treatment apparatus is preferably 6N (99.9999%) or more, more preferably 7N (99.99999%) or more (i.e., the concentration of impurities is 1 ppm or lower, preferably 0.1 ppm or lower).

The second heat treatment is performed while the oxide semiconductor layer 106 and the gate insulating layer 112 are in contact with each other. Thus, oxygen which is one of main components of the oxide semiconductor can be supplied from the gate insulating layer 112 containing oxygen to the oxide semiconductor layer 106. Accordingly, oxygen deficiency in the oxide semiconductor layer 106 and an interface state between the oxide semiconductor layer and the gate insulating layer 112 can be reduced. At the same time, defects in the gate insulating layer 112 can also be reduced.

Note that there is no particular limitation on the timing of the second heat treatment as long as it is after the gate insulating layer 112 is formed. For example, the second heat treatment may be performed after the second gate electrode layer 115 is formed.

Figure 5E:
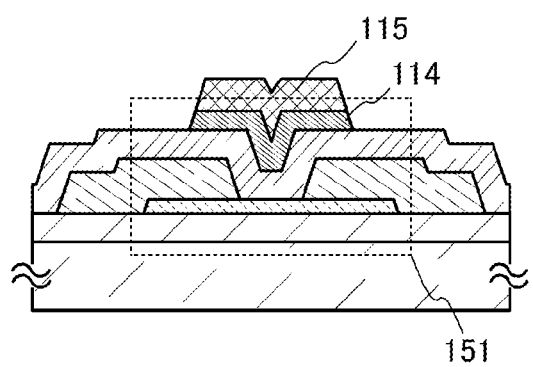

Then, the first gate electrode layer 114 and the second gate electrode layer 115 are formed (see FIG. 5E). As a material of the first gate electrode layer, an In—Ga—Zn—O—N-based compound film which is obtained using the In—Ga—Zn—O—N-based compound manufactured in Embodiment 1 as a sputtering target is used.

The thickness of the In—Ga—Zn—O—N-based compound film is preferably greater than or equal to 10 nm and less than or equal to 50 nm. As the sputtering target of an In—Ga—Zn—O—N-based compound, a sputtering target which has a composition ratio of In:Ga:Zn=1:1:1 [molar ratio] and in which a ratio of oxygen to nitrogen is 7:1 can be used, for example. Note that it is not necessary to limit the composition of the sputtering target to the above. For example, a sputtering target having a composition ratio of In:Ga:Zn=1:1:2 [molar ratio] can be used.

A deposition atmosphere is preferably an atmosphere containing only a rare gas (typically, argon), or a mixed atmosphere of a rare gas and nitrogen; for an increase in a deposition rate, the total percentage of argon, krypton, and xenon in the atmosphere is preferably 80% or more. Further, it is preferable that the concentration of oxygen in the atmosphere be 5% or less.

An example of the deposition conditions is as follows: the distance between the substrate and the sputtering target is 60 mm; the pressure is 0.4 Pa; the direct-current (DC) power is 0.5 kW; and the deposition atmosphere is a mixed atmosphere containing argon and nitrogen (the proportion of the nitrogen flow is 12.5%).

The second gate electrode layer 115 can be formed using a metal material such as molybdenum, titanium, tantalum, tungsten, aluminum, copper, neodymium, or scandium, nitride of any of these metal materials, or an alloy material which contains any of these metal materials as its main component. Note that the second gate electrode layer 115 may have a single-layer structure or a stacked-layer structure. These metals are deposited over the In—Ga—Zn—O—N-based compound film by a method such as sputtering and etched into a desired shape, so that the first gate electrode layer 114 and the second gate electrode layer 115 are formed. Through the above process, the transistor 151 is formed.

Although an In—Ga—Zn—O—N-based compound is used for the first gate electrode layer 114 in this embodiment, the present invention is not limited thereto and the following oxynitrides may be used: an In—Sn—Ga—Zn—O—N-based compound, an In—Sn—Zn—O—N-based compound, an In—Al—Zn—O—N-based compound, a Sn—Ga—Zn—O—N-based compound, an Al—Ga—Zn—O—N-based compound, a Sn—Al—Zn—O—N-based compound, an In—Zn—O—N-based compound, a Ga—Zn—O—N-based compound, a Sn—Zn—O—N-based compound, an Al—Zn—O—N-based compound, an In—O—N-based compound, a Sn—O—N-based compound, a Ga—O—N-based compound, and a Zn—O—N-based compound. Further, in that case, the oxynitride can be used as a sputtering target.

Further, although an In—Ga—Zn—O-based compound is used for the oxide semiconductor layer in this embodiment, the present invention is not limited thereto and an oxide semiconductor containing at least indium (In) or zinc (Zn) may be used. It is particularly preferable that an oxide semiconductor containing both In and Zn be used.

As a stabilizer for reducing variation in electrical characteristics of a transistor using an oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Titanium (Ti) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As an oxide semiconductor, for example, indium oxide, tin oxide, zinc oxide, a two-component metal oxide such as an In—Zn—O-based compound, a Sn—Zn—O-based compound, an Al—Zn—O-based compound, a Zn—Mg—O-based compound, a Sn—Mg—O-based compound, an In—Mg—O-based compound, or an In—Ga—O-based compound, a three-component metal oxide such as an In—Al—Zn—O-based compound, an In—Sn—Zn—O-based compound, a Sn—Ga—Zn—O-based compound, an Al—Ga—Zn—O-based compound, a Sn—Al—Zn—O-based compound, an In—Hf—Zn—O-based compound, an In—Ti—Zn—O-based compound, an In—Zr—Zn—O-based compound, an In—La—Zn—O-based compound, an In—Ce—Zn—O-based compound, an In—Pr—Zn—O-based compound, an In—Nd—Zn—O-based compound, an In—Sm—Zn—O-based compound, an In—Eu—Zn—O-based compound, an In—Gd—Zn—O-based compound, an In—Tb—Zn—O-based compound, an In—Dy—Zn—O-based compound, an In—Ho—Zn—O-based compound, an In—Er—Zn—O-based compound, an In—Tm—Zn—O-based compound, an In—Yb—Zn—O-based compound, or an In—Lu—Zn—O-based compound, or a four-component metal oxide such as an In—Sn—Ga—Zn—O-based compound, an In—Hf—Ga—Zn—O-based compound, an In—Al—Ga—Zn—O-based compound, an In—Ti—Ga—Zn—O-based compound, an In—Zr—Ga—Zn—O-based compound, an In—Sn—Al—Zn—O-based compound, an In—Sn—Hf—Zn—O-based compound, or an In—Hf—Al—Zn—O-based compound can be used.

Alternatively, a material represented by $InMO_3(ZnO)_m$ (m>0, and m is not an integer) may be used as the oxide semiconductor. Note that M represents one or more metal elements selected from Ga, Fe, Mn, and Co. Further alternatively, as the oxide semiconductor, a material represented by $In_2SnO_5(ZnO)_n$ (n>0, and n is an integer) may be used.

For example, an In—Ga—Zn—O-based compound with an atomic ratio of In:Ga:Zn=2:2:1 (=2/5:2/5:1/5), or any of compounds whose composition is in the neighborhood of the above composition can be used. Alternatively, an In—Sn—Zn—based compound with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of compounds whose composition is in the neighborhood of the above compositions is preferably used.

Further, in the case where an In—Zn—O-based material is used as an oxide semiconductor, a target used has a composition ratio of In:Zn=50:1 to 1:2 in an atomic ratio, preferably In:Zn=20:1 to 1:1 in an atomic ratio, more preferably In:Zn=15:1 to 3:2 in an atomic ratio. Furthermore, a target used for the formation of an In—Zn—O-based oxide semiconductor can have an atomic ratio of In:Zn:O=1:1:X, where X>1, preferably X>1.5.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the concentration of impurities, the defect density, the atomic ratio of a metal element to oxygen, the interatomic distance, the density, and the like be set to be appropriate.

For example, with the In—Sn—Zn—O-based compound, a high mobility can be relatively easily obtained. Even when the In—Ga—Zn—O-based compound is used, the mobility can be increased by a reduction in bulk defect density.

Note that for example, the expression "the composition of an In—Sn—Zn—O-based compound including In, Ga, and Zn at the atomic ratio, In:Ga:Zn=a:b:c (a+b+c=1), is in the neighborhood of the composition of an In—Sn—Zn—O-based compound including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other compounds.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, in this embodiment, the oxide semiconductor is preferably formed over a surface of the insulating layer 102 with an average surface roughness ($R_a$) of 1 nm or less, preferably 0.3 nm or less, more preferably 0.1 nm or less.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface".

Embodiment 3

In this embodiment, an example of a manufacturing process of the transistor 152 in FIG. 4A will be described below with reference to FIGS. 6A to 6E.

Figure 6A:
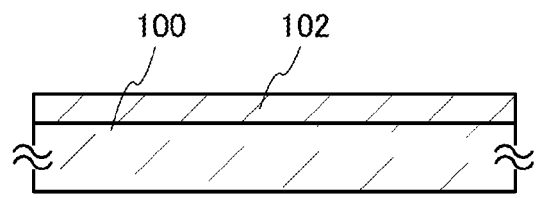
FIGS. 6A to 6E are cross-sectional views illustrating an example of a manufacturing process of a semiconductor device that is one embodiment of the present invention.
Figure 6B:
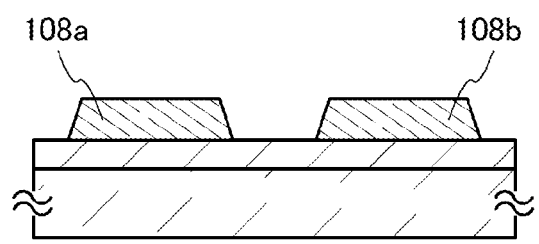

First, the insulating layer 102 is formed over the substrate 100 (see FIG. 6A). Next, a conductive layer for forming of the source electrode and the drain electrode (including a wiring formed in the same layer as the source electrode and the drain electrode) is formed over the insulating layer 102 and processed to form the source electrode 108a and the drain electrode 108b (see FIG. 6B).

Figure 6C:
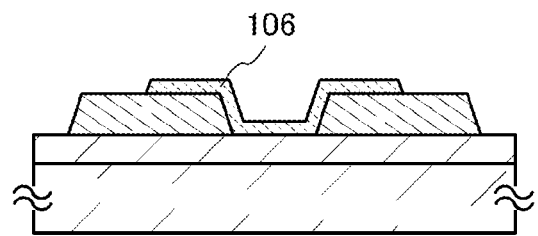

Next, an oxide semiconductor layer connected to the source electrode 108a and the drain electrode 108b is formed over the insulating layer 102 and then is processed to form the oxide semiconductor layer 106 having an island shape (see FIG. 6C). After that, first heat treatment similar to that performed on the transistor 151 may be performed.

Figure 6D:
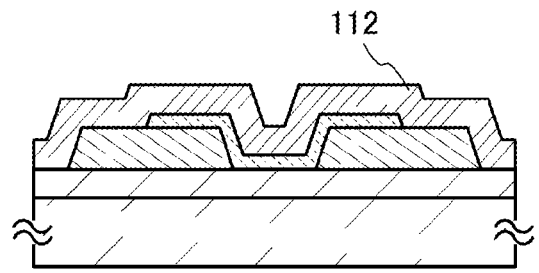

Next, the gate insulating layer 112 is formed so as to cover the source electrode 108a and the drain electrode 108b and to be in contact with part of the oxide semiconductor layer 106 (see FIG. 6D).

Figure 6E:
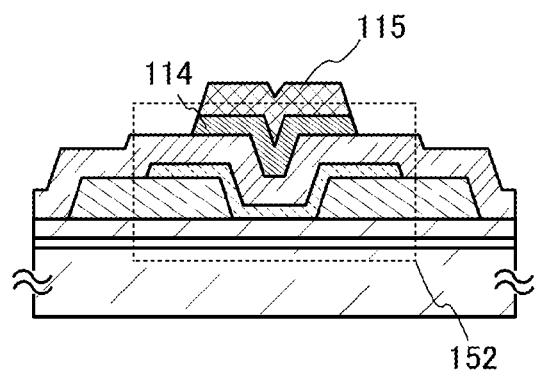

Then, the first gate electrode layer 114 and the second gate electrode layer 115 are formed (see FIG. 6E). The first gate electrode layer 114 may be formed by sputtering using the sputtering target of an In—Ga—Zn—O—N-based compound which is described in Embodiment 1. Through the above process, the transistor 152 is formed.

Although an In—Ga—Zn—O—N-based compound is used for the first gate electrode layer 114 in this embodiment, the present invention is not limited thereto and the following oxynitrides may be used: an In—Sn—Ga—Zn—O—N-based compound, an In—Sn—Zn—O—N-based compound, an In—Al—Zn—O—N-based compound, a Sn—Ga—Zn—O—N-based compound, an Al—Ga—Zn—O—N-based compound, a Sn—Al—Zn—O—N-based compound, an In—Zn—O—N-based compound, a Ga—Zn—O—N-based compound, a Sn—Zn—O—N-based compound, an Al—Zn—O—N-based compound, an In—O—N-based compound, a Sn—O—N-based compound, a Ga—O—N-based compound, and a Zn—O—N-based compound. Further, in that case, the oxynitride can be used as a sputtering target.

Embodiment 4

In this embodiment, an example of a manufacturing process of the transistor 153 in FIG. 4B will be described with reference to FIGS. 7A to 7E.

Figure 7A:
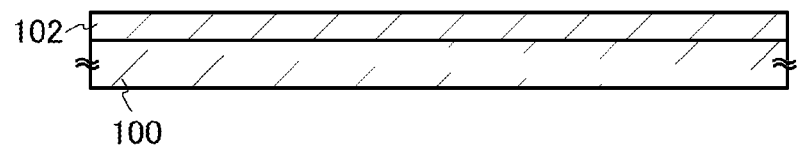
FIGS. 7A to 7E are cross-sectional views illustrating an example of a manufacturing process of a semiconductor device that is one embodiment of the present invention.
Figure 7B:
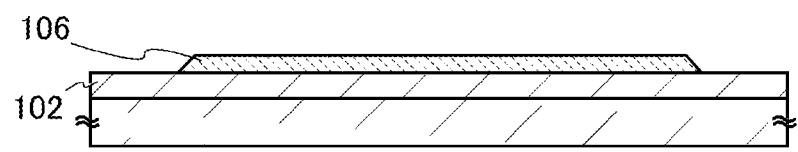

First, the insulating layer 102 is formed over the substrate 100 (see FIG. 7A). Next, an oxide semiconductor layer is formed over the insulating layer 102 and processed to form the oxide semiconductor layer 106 having an island shape (see FIG. 7B).

Figure 7C:
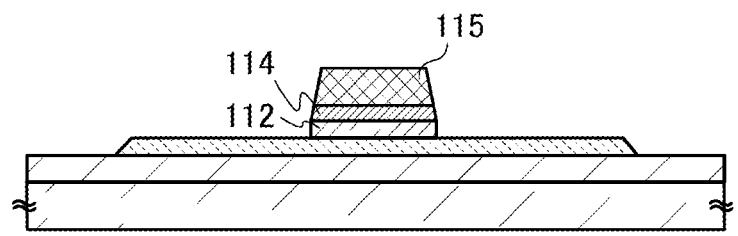
Figure 7D:
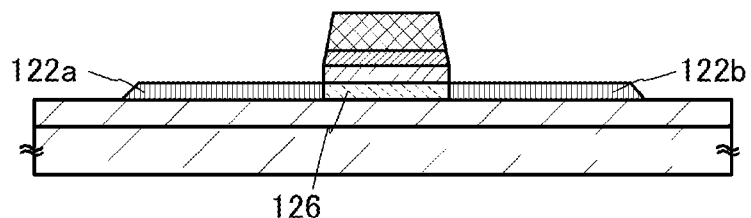
Figure 7E:
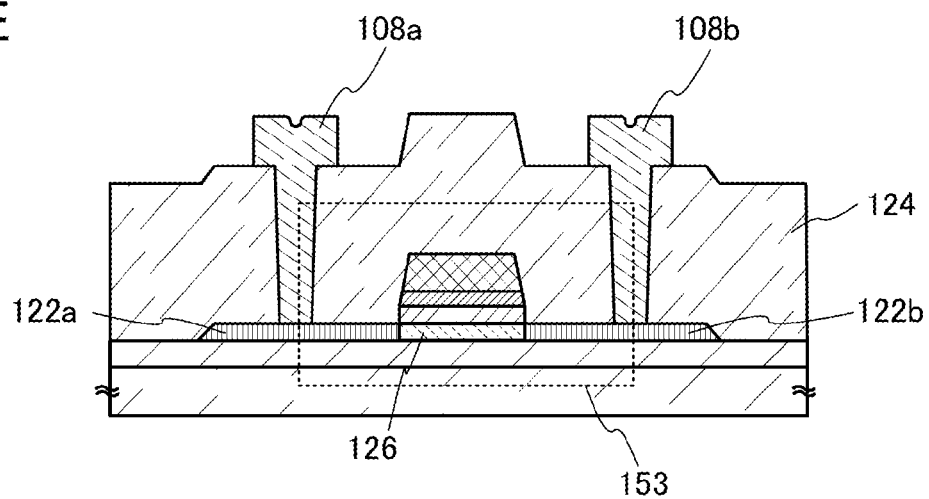

Next, an insulating layer to be the gate insulating layer 112, an In—Ga—Zn—O—N-based compound film to be the first gate electrode layer 114, and a conductive film to be the second gate electrode layer 115 are formed and processed to have similar patterns by photolithography, so that the gate insulating layer 112, the first gate electrode layer 114, and the second gate electrode layer 115 are obtained (see FIG. 7C). The In—Ga—Zn—O—N-based compound film may be formed by sputtering using the sputtering target of an In—Ga—Zn—O—N-based compound which is described in Embodiment 1 in an atmosphere containing nitrogen.

Next, the resistance of the oxide semiconductor layer 106 is reduced using the first gate electrode layer 114 and the second gate electrode layer 115 as a mask, so that the source region 122a and the drain region 122b are formed. A region under the first gate electrode layer 114 and the second gate electrode layer 115 where the resistance is not reduced becomes the channel region 126 (see FIG. 7D). As a method for reducing the resistance, argon plasma treatment, hydrogen plasma treatment, ammonia plasma treatment, and the like can be given. Alternatively, implantation of ions of an element which is easily oxidized, such as phosphorus ions or boron ions, may be performed.

At this time, the channel length L of the transistor is determined by the width of the first gate electrode layer 114 and the second gate electrode layer 115. By patterning using the first gate electrode layer 114 and the second gate electrode layer 115 as the mask in this manner, the source region 122a and the drain region 122b do not overlap with the first gate electrode layer 114 and the second gate electrode layer 115 and parasitic capacitance is not generated in this region; therefore, the operation speed of the transistor can be increased.

Next, the protective insulating layer 124 is formed and an opening is provided in a region of the protective insulating layer 124, which is overlapped with the source region 122a and the drain region 122b. A conductive layer for forming of the source electrode and the drain electrode (including a wiring formed in the same layer as the source electrode and the drain electrode) is formed and processed to form the source electrode 108a and the drain electrode 108b (see FIG. 7E). Through the above process, the transistor 153 is formed.

Although an In—Ga—Zn—O—N-based compound is used for the first gate electrode layer 114 in this embodiment, the present invention is not limited thereto and the following oxynitrides may be used: an In—Sn—Ga—Zn—O—N-based compound, an In—Sn—Zn—O—N-based compound, an In—Al—Zn—O—N-based compound, a Sn—Ga—Zn—O—N-based compound, an Al—Ga—Zn—O—N-based compound, a Sn—Al—Zn—O—N-based compound, an In—Zn—O—N-based compound, a Ga—Zn—O—N-based compound, a Sn—Zn—O—N-based compound, an Al—Zn—O—N-based compound, an In—O—N-based compound, a Sn—O—N-based compound, a Ga—O—N-based compound, and a Zn—O—N-based compound. Further, in that case, the oxynitride can be used as a sputtering target.

Embodiment 5

A semiconductor device which is one embodiment of the present invention can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment are described.

Figure 8A:
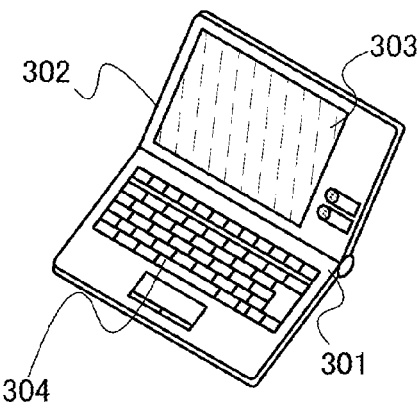
FIGS. 8A to 8F each illustrate an application example of the present invention.

FIG. 8A illustrates a laptop, which includes a main body 301, a housing 302, a display portion 303, a keyboard 304, and the like. By applying any of the semiconductor devices described in Embodiments 2 to 4, the laptop can have excellent characteristics and high reliability.

Figure 8B:
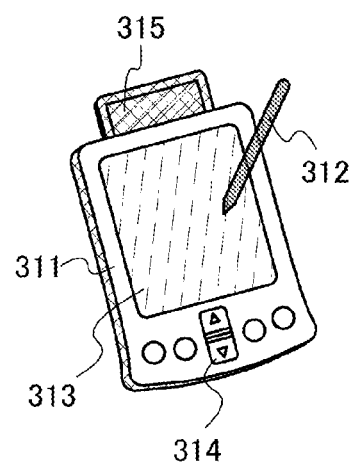

FIG. 8B illustrates a portable information terminal (PDA) which includes a display portion 313, an external interface 315, an operation button 314, and the like in a main body 311. A stylus 312 is included as an accessory for operation. By applying any of the semiconductor devices described in Embodiments 2 to 4, the portable information terminal (PDA) can have excellent characteristics and high reliability.

Figure 8C:
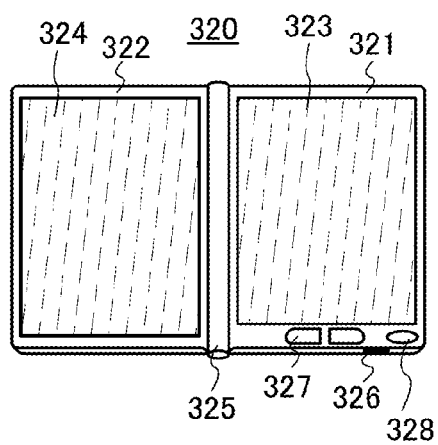

FIG. 8C illustrates an example of an e-book reader. For example, an e-book reader 320 includes two housings, a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 and a display portion 324 are incorporated in the housing 321 and the housing 322, respectively. The display portion 323 and the display portion 324 may display one image or different images. When the display portion 323 and the display portion 324 display different images, for example, text can be displayed on a display portion on the right side (the display portion 323 in FIG. 8C) and graphics can be displayed on a display portion on the left side (the display portion 324 in FIG. 8C). By applying any of the semiconductor devices described in Embodiments 2 to 4, the e-book reader can have excellent characteristics and high reliability.

FIG. 8C illustrates an example in which the housing 321 is provided with an operation portion and the like. For example, the housing 321 is provided with a power switch 326, an operation key 327, a speaker 328, and the like. With the operation key 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 320 may have a function of an electronic dictionary.

The e-book reader 320 may have a configuration capable of wirelessly transmitting and receiving data. Through wireless communication, desired book data or the like can be purchased and downloaded from an e-book server.

Figure 8D:
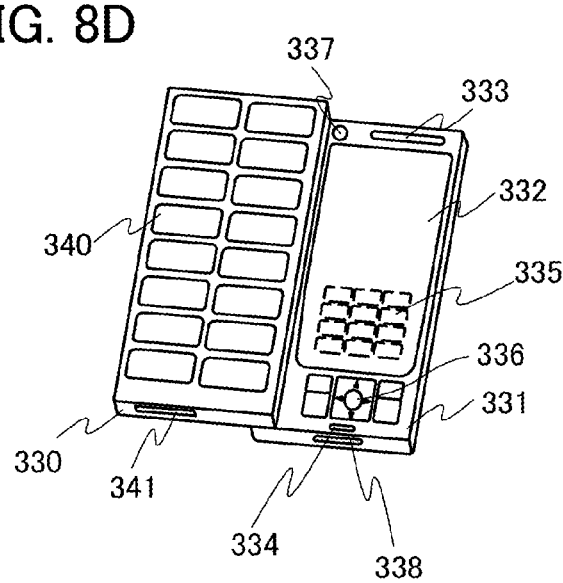

FIG. 8D illustrates a mobile phone, which includes two housings, a housing 330 and a housing 331. The housing 331 includes a display panel 332, a speaker 333, a microphone 334, a pointing device 336, a camera lens 337, an external connection terminal 338, and the like. In addition, the housing 330 includes a solar cell 340 having a function of charge of the mobile phone, an external memory slot 341, and the like. Further, an antenna is incorporated in the housing 331. By applying any of the semiconductor devices described in Embodiments 2 to 4, the mobile phone can have excellent characteristics and high reliability.

Further, the display panel 332 is provided with a touch screen. A plurality of operation keys 335 which are displayed as images are illustrated by dashed lines in FIG. 8D. Note that a boosting circuit by which a voltage output from the solar cell 340 is increased to be sufficiently high for each circuit is also included.

In the display panel 332, the display orientation changes as appropriate in accordance with the application mode. Further, the mobile phone is provided with the camera lens 337 on the same surface as the display panel 332, and thus it can be used as a video phone. The speaker 333 and the microphone 334 can be used for videophone calls, recording and playing sound, and the like as well as voice calls. Moreover, the housings 330 and 331 in a state where they are opened as illustrated in FIG. 8D can be slid so that one overlaps the other; therefore, the size of the mobile phone can be reduced, which makes the mobile phone suitable for being carried.

The external connection terminal 338 can be connected to an AC adapter and various types of cables such as a USB cable, and charging and data communication with a personal computer are possible. Moreover, a larger amount of data can be saved and moved by inserting a recording medium to the external memory slot 341.

Further, in addition to the above functions, an infrared communication function, a television reception function, or the like may be provided.

Figure 8E:
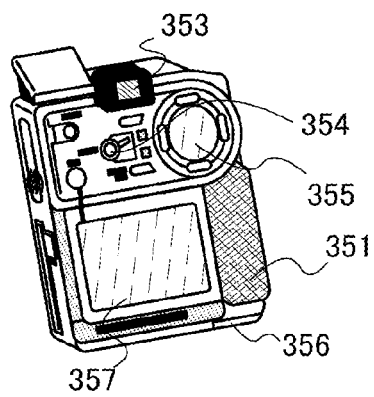

FIG. 8E illustrates a digital video camera which includes a main body 351, a display portion (A) 357, an eyepiece 353, an operation switch 354, a display portion (B) 355, a battery 356, and the like. By applying any of the semiconductor devices described in Embodiments 2 to 4, the digital video camera can have excellent characteristics and high reliability.

Figure 8F:
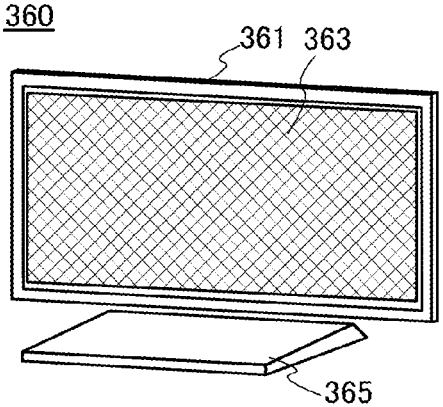

FIG. 8F illustrates an example of a television set. In a television set 360, a display portion 363 is incorporated in a housing 361. The display portion 363 can display images. Here, the housing 361 is supported by a stand 365. By applying any of the semiconductor devices described in Embodiments 2 to 4, the television set 360 can have excellent characteristics and high reliability.

The television set 360 can be operated by an operation switch of the housing 361 or a separate remote controller. Further, the remote controller may be provided with a display portion for displaying data output from the remote controller.

Note that the television set 360 is provided with a receiver, a modem, and the like. With the use of the receiver, general television broadcasting can be received. Furthermore, when the television set is connected to a communication network with or without wires via the modem, one-way (from a sender to a receiver) or two-way (between a sender and a receiver or between receivers) information communication can be performed.

This application is based on Japanese Patent Application serial No. 2010-281429 filed with Japan Patent Office on Dec. 17, 2010, the entire contents of which are hereby incorporated by reference.

What is claimed is:

1. A method for manufacturing a semiconductor device comprising the steps of:
    forming a gate electrode comprising an oxynitride film over a substrate with the use of a sputtering target; and
    forming an oxide semiconductor film over the gate electrode,
    wherein the semiconductor device comprises a transistor,
    wherein the oxide semiconductor film comprises a channel formation region of the transistor,
    wherein the oxide semiconductor film is formed in an argon atmosphere, an oxygen atmosphere, or a mixed atmosphere containing argon and oxygen,
    wherein the sputtering target includes a sintered body of an oxynitride comprising at least two elements selected from indium, gallium, zinc, and tin, and
    wherein a concentration of nitrogen in the sintered body of the oxynitride is 4 atomic % or more.

2. The method for manufacturing a semiconductor device according to claim 1, wherein a total percentage of argon, krypton, and xenon in a sputtering gas used in the step of forming the oxynitride film over the substrate is 80% or more.

3. The method for manufacturing a semiconductor device according to claim 1, wherein the concentration of nitrogen in the sintered body of the oxynitride is 20 atomic % or more.

4. The method for manufacturing a semiconductor device according to claim 1, wherein a concentration of an alkali metal in the sintered body of the oxynitride is $5 \times 10^{16}$ atoms/cm$^3$ or lower.

5. The method for manufacturing a semiconductor device according to claim 1, wherein a concentration of hydrogen in the sintered body of the oxynitride is $1 \times 10^{16}$ atoms/cm$^3$ or lower.

6. The method for manufacturing a semiconductor device according to claim 1, wherein the oxynitride is an In—Ga—Zn—O—N-based compound.

7. A method for manufacturing a semiconductor device comprising the steps of:
    forming an oxide semiconductor film over a substrate; and
    forming a gate electrode comprising an oxynitride film over the oxide semiconductor film with the use of a sputtering target,
    wherein the semiconductor device comprises a transistor, wherein the oxide semiconductor film comprises a channel formation region of the transistor, wherein the oxide semiconductor film is formed in an argon atmosphere, an oxygen atmosphere, or a mixed atmosphere containing argon and oxygen, wherein the sputtering target includes a sintered body of an oxynitride comprising at least two elements selected from indium, gallium, zinc, and tin, and wherein a concentration of nitrogen in the sintered body of the oxynitride is 4 atomic % or more.

8. The method for manufacturing a semiconductor device according to claim 7, wherein a total percentage of argon, krypton, and xenon in a sputtering gas used in the step of forming the oxynitride film over the substrate is 80% or more.

9. The method for manufacturing a semiconductor device according to claim 7, wherein the concentration of nitrogen in the sintered body of the oxynitride is 20 atomic % or more.

10. The method for manufacturing a semiconductor device according to claim 7, wherein a concentration of an alkali metal in the sintered body of the oxynitride is $5 \times 10^{16}$ atoms/cm$^3$ or lower.

11. The method for manufacturing a semiconductor device according to claim 7, wherein a concentration of hydrogen in the sintered body of the oxynitride is $1 \times 10^{16}$ atoms/cm$^3$ or lower.

12. The method for manufacturing a semiconductor device according to claim 7, wherein the oxynitride is an In—Ga—Zn—O—N-based compound.

* * * * *